United States Patent
Palm (10) Patent No.: US 8,962,995 B2
(45) Date of Patent: Feb. 24, 2015

(54) LAYER SYSTEM FOR SOLAR CELLS

(75) Inventor: Jorg Palm, Munich (DE)

(73) Assignee: Saint Gobain Glass France (FR)

( * ) Notice: Subject to any disclaimer, the term of this patent is extended or adjusted under 35 U.S.C. 154(b) by 130 days.

(21) Appl. No.: 12/992,199

(22) PCT Filed: May 19, 2009

(86) PCT No.: PCT/EP2009/003587
§ 371 (c)(1),
(2), (4) Date: Mar. 15, 2011

(87) PCT Pub. No.: WO2009/141132
PCT Pub. Date: Nov. 26, 2009

(65) Prior Publication Data
US 2011/0168258 A1 Jul. 14, 2011

(30) Foreign Application Priority Data
May 19, 2008 (DE) .......................... 10 2008 024 230

(51) Int. Cl.
*H01L 31/0272* (2006.01)
*H01L 31/032* (2006.01)
*H01L 31/0749* (2012.01)

(52) U.S. Cl.
CPC ........ *H01L 31/0322* (2013.01); *H01L 31/0749* (2013.01); *Y02E 10/541* (2013.01)
USPC ............ 136/265; 136/262; 136/264; 136/252

(58) Field of Classification Search
CPC .............. H01L 31/0322; H01L 31/072; H01L 31/0749; Y02E 10/541
USPC ................................. 136/265, 262, 264, 252
See application file for complete search history.

(56) References Cited

U.S. PATENT DOCUMENTS

| | | | | |
|---|---|---|---|---|
| 5,141,564 A | * | 8/1992 | Chen et al. | 136/258 |
| 5,286,306 A | * | 2/1994 | Menezes | 136/249 |
| 5,981,868 A | * | 11/1999 | Kushiya et al. | 136/262 |
| 6,040,521 A | * | 3/2000 | Kushiya et al. | 136/265 |
| 6,048,442 A | * | 4/2000 | Kushiya et al. | 204/192.28 |
| 6,092,669 A | * | 7/2000 | Kushiya et al. | 204/298.13 |

(Continued)

FOREIGN PATENT DOCUMENTS

| | | |
|---|---|---|
| DE | 102006039331 | 2/2008 |
| JP | 11026790 | 1/1999 |

OTHER PUBLICATIONS

Palm et al., "Second generation CIS solar modules", Solar Energy 77 (2004) 757-765.*

(Continued)

*Primary Examiner* — Golam Mowla
(74) *Attorney, Agent, or Firm* — Steinfl & Bruno LLP (57) ABSTRACT

The present invention relates to a layer system (1) for thin-film solar cells and solar modules based on CIS-absorbers (4). The layer system (1) according to the invention has a buffer layer (4) made of $In_2(S_{1-x},Se_x)_{3+\delta}$, wherein $0 \leq x \leq 1$ and $-1 \leq \delta \leq 1$. Additionally, the buffer layer (5) is amorphously designed. With this buffer layer (5), the disadvantages of CdS-buffers frequently used to date, namely toxicity and poor process integration, are overcome, whereby in addition to high efficiency, high long-term stability is also achieved; and thus again the disadvantages of conventional buffer layers alternative to CdS do not exist.

14 Claims, 6 Drawing Sheets

(56) References Cited

U.S. PATENT DOCUMENTS

| | | | |
|---|---|---|---|
| 7,744,705 B2* | 6/2010 | Alberts | 148/432 |
| 2005/0202589 A1* | 9/2005 | Basol | 438/102 |
| 2006/0102230 A1* | 5/2006 | Tuttle | 136/265 |
| 2006/0121701 A1* | 6/2006 | Basol | 438/483 |
| 2009/0148598 A1* | 6/2009 | Zolla et al. | 427/251 |
| 2009/0162969 A1* | 6/2009 | Basol | 438/95 |

OTHER PUBLICATIONS

PCT International Search Report for PCT/EP2009/003587 filed on May 19, 2009 in the name of Jorg Palm.

PCT Written Opinion for PCT/EP2009/003587 filed on May 19, 2009 in the name of Jorg Palm (English + German).

Rudigier, E., et al., Towards a fast process control for Cu(In,Ga)(Se,S) absorbers. The surface chalcogen ratio assessed by raman spectroscopy, 19$^{th}$ European Photovoltaic Solar Energy Conference, Jun. 7-11, 2004, Paris, France 1913-196.

Lokhande, CD, et al., Chemical bath deposition of indium sulphide thin films: preparation and characterization, Thin Solid Films 1999, 18-23.

Qasrawi, Q., Temperature dependence of the band gap, refractive index and single-oscilator parameters of amorphous indium selentide thin films, Optical Methods 2007, 29: 1753-1755.

* cited by examiner

LAYER SYSTEM FOR SOLAR CELLS

CROSS REFERENCE TO RELATED APPLICATIONS

The present application is the US national stage of International Application PCT/EP2009/003587 filed on May 19, 2009 which, in turn, claims priority to German Application DE 102008024230.6, filed on May 19, 2008.

The present invention relates to a layer system, in particular for thin-film solar cells, solar modules, or the like, according to the generic part of claim 1 and solar cells or solar cell modules with this layer system.

Thin-film systems for solar cells and solar modules are sufficiently known and available on the market in various designs depending on the substrate and the materials applied thereon. The materials are selected such that the incident sun spectrum is utilized to the maximum. Thin-film cells made of semiconductor materials are currently obtainable commercially, for example, made of cadium-telluride (CdTe), or copper-indium (gallium)-sulfur-selenium-compounds (Cu(In/Ga)(Se/S)), known as CIS-or CIGS cells, where, depending on the cell type, S can represent sulfur and/or selenium. Most frequently, amorphous silicon (a:Si:H) is used for thin-film cells. Nowadays, CIS thin-film cells achieve roughly the same level of efficiency as modules made from multicrystalline silicon.

Current thin-film solar cells and solar modules based on $Cu(In,Ga)(S,Se)_2$ require a buffer layer between p-conductive $Cu(In,Ga)(S,Se)_2$-absorber and n-conductive front electrode that usually comprises zinc oxide (ZnO). According to current knowledge, this buffer layer enables electronic adaptation between the absorber material and the front electrodes. Moreover, it offers protection against sputtering damage in the subsequent process step of deposition of the front electrode by DC-magnetron sputtering. Additionally, by constructing a high-ohm intermediate layer between p- and n-semiconductors, it prevents current drain from electrically good zones into poor zones.

To date, cadmium sulfide (CdS) has been most frequently used as a buffer layer. To be able to produce good efficiency of the cells, CdS has, to date, been deposited in a CBD process (chemical bath process), a wet chemical process. However, associated with this is the disadvantage that the wet chemical process does not fit well into the process cycle of the current production of $Cu(In,Ga)(S,Se)_2$-thin-film solar cells.

A further disadvantage of the CdS-buffer layer consists in that it includes the toxic heavy metal cadmium. This creates higher production costs since increased safety precautions must be taken in the production process, e.g., in the disposal of wastewater. The disposal of the product may, under certain circumstances, also cause higher costs for the consumer, since the manufacturer may be forced, depending on local law, to take back, to dispose of, or to recycle the product, and the resultant costs would be passed on to the consumer.

Consequently, various alternatives to the buffer made of CdS have been tested for different absorbers from the family of the $Cu(In,Ga)(S,Se)_2$-semiconductor; e.g., sputtered ZnMgO, Zn(S,OH) deposited by CBD, In(O,OH) deposited by CBD, and indium sulfide, ILGAR (ion layer gas deposition), deposited by ALD (atomic layer deposition), spray pyrolysis, or PVD (physical vapor deposition) processes, for instance, thermal vaporization or sputtering.

However, these materials still are not suitable as a buffer for solar cells based on $Cu(In,Ga)(S,Se)_2$ for commercial use, since they do not achieve the same efficiency (ratio of power shining in to the electrical power produced by a solar cell) as those with a CdS buffer layer, which are roughly up to 20% for lab cells on small surfaces and between 10% and 12% for large-area modules. Moreover, they present excessive instabilities, hysteresis effects, or degradation in efficiency when they are exposed to light, heat, and/or moisture.

A further disadvantage of CdS is based on the fact that CdS is a direct semiconductor with a direct electronic bandgap of roughly 2.4 eV; and, consequently, in a $Cu(In,Ga)(S,Se)_2$/CdS/ZnO solar cell already with CdS-film thicknesses of a few 10 nm, the incident light is absorbed. Since there are many crystal defects in this range of heterotransition and in the buffer material, i.e., there are recombination centers, the charge carriers generated in this layer recombine right away. Thus, the light absorbed in the buffer layer is lost for the electrical yield, i.e., the efficiency of the solar cell is reduced, which is disadvantageous for a thin-film cell.

Consequently, the object of the present invention is to provide a layer system based on $Cu(In,Ga)(S,Se)_2$, in particular for solar cells, solar modules, or the like, with a buffer layer that has high efficiency and high stability, whereby manufacture is cost effective and environmentally harmless.

This object is accomplished according to invention by a layer system according to claim 1 and a solar cell or a solar cell module according to claim 11. Advantageous improvements of the invention are presented in the subordinate claims.

The invention is distinguished in that the layer system comprises an absorber layer made of a compound semiconductor material with a chalcopyrite structure ($Cu(In,Ga)(S_{1-y},Se_y)_2$, where $0 \leq y \leq 1$) and a first buffer layer, with the first buffer layer comprising $In_2(S_{1-x},Se_x)_{3+\delta}$ (indium sulfide selenide) and $0 \leq x \leq 1$ and $-1 \leq \delta \leq 1$ (x and $\delta$ may even be 0). Moreover, the $In_2(S_{1-x},Se_x)_{3+\delta}$ buffer layer is amorphous.

The solar cells manufactured with this layer system have high efficiency with high long-term stability at the same time. Since, now, no toxic substances are used, the manufacturing process is easier on the environment and cheaper and there are no subsequent costs, as with CdS buffer layers.

In particular, it surprisingly turned out that with the layer system according to the invention, comparably good solar cell characteristics can be achieved as with prior art CdS buffer layers. In fact, with the structure according to the invention, high efficiencies of 12.2% to 14.3% can be achieved.

In the context of the present invention, "amorphous" means that in x-ray structure investigations, the signals that a crystalline structure reflects are below the detection limit. Moreover, the Raman spectrum (at 488 nm excitation wavelength) of the layers in the range of 220 $cm^{-1}$ and 380 $cm^{-1}$ wavenumbers shows a wide band with a maximum at 290 $cm^{-1}$, in which individual lines are no longer resolvable. In the investigations underlying this invention, it was shown that the indium sulfide layers had usually grown amorphously on the glass substrates. On the absorber layers, they were, depending on process conditions, either amorphous or crystalline. Surprisingly, only the layer systems in which the indium sulfide layer on the absorber had grown amorphously yielded particularly good efficiency greater than 12%. Layers with crystalline indium sulfide yielded efficiencies between 6 and 12%.

Preferably, the first buffer layer contains no impurities, in other words, it is not intentionally provided with additional elements, such as oxygen, carbon, or chlorine and contains these at most in the context of manufacturing technology in unavoidable concentrations less than or equal to 1 Mol %. This makes it possible to ensure higher efficiency.

Advantageously, the deviation from stoichiometry characterized as "$\delta$" is between −0.5 and +0.5, preferably between −0.2 and 0. Here, a value is preferred that is roughly δ=−0.1, since with this slightly indium-rich composition, the best cells could be obtained.

The high efficiency is largely determined by the amorphous formation of the first buffer layer. Investigations show, in fact, a reciprocal connection between efficiency and crystallinity for the layers and deposition processes used here. The less crystalline, i.e., the more amorphous the structure, the more advantageous for efficiency. Moreover, amorphous layers can be produced at lower temperatures, as a result of which a massive interdiffusion of the elements between the buffer and the absorber are [sic] avoided and production is made generally easier. Amorphous semiconductor layers have, to date, been used in solar cells only in the case of amorphous silicon-germanium layer systems as well as in hetero-transitions of crystalline and amorphous silicon. For chalcopyrite semiconductors, combinations with an amorphous buffer or amorphous front electrodes are, to date, unknown.

A further advantage of the layer system according to the invention consists in that the cells have greater stability against temperature, light, moisture, as well as mechanical and electrical stress. In the prior art solar cells based on chalcopyrite, hysteresis effects are, in fact, often observed: Efficiency can be degraded by the effect of heat and/or moisture. Through light soaking, efficiency can, to be sure, be partially restored. However, in the worst case, irreversible losses remain. In many cases, the efficiency is adjusted after production of the cells only through long light soaking. With the solar cells produced with the layer system according to the invention, the measurements of the altering effects under moist heat (85% relative humidity, 85° C. temperature) show that the unencapsulated or encapsulated cells behave the same or better than those with a CdS-buffer layer and ZnO-front electrode. Light exposure of cells according to invention also causes little change in efficiency, namely less than 5%, which is a marked improvement of the stability of the layer system.

From measurements of optical transmission as a function of the wave-length of $In_2(S_{1-x},Se_x)_{3+\delta}$-layers on glass, it has been determined using Tauc plots that the bandgap $E_G$ of the first buffer layer is between 2.0 and 2.2 eV. This bandgap is, to be sure, smaller than that of CdS; however, CdS is a direct semiconductor, whereas the evaluation of the Tauc plots showed that the $In_2(S_{1-x},Se_x)_{3+\delta}$-layers used have a direct and forbidden or indirect nature of the bandgap, as a result of which a lower absorption of light in the buffer layer is possible with comparable layer thicknesses. However, a lower optical absorption results in higher efficiency for the conversion of light into electrical power.

Preferably, the selenium content x is between 0 and 0.5, preferably between 0 and 0.1. Minimal selenium contents x can be expedient, e.g., with x=0.08, x=0.05, x=0.03, x=0.01, or x=0.001. The selenium content can actually also be x=0. Through the variation of the selenium content, the bandgap of the first buffer layer and its band matching to the absorber layer made of $Cu(In,Ga)(S,Se)_2$ take place, with the efficiency level highest at these selenium contents. Through the adjustment of the selenium content, fine tuning of the bandgap and of band matching is thus possible compared to $In_2(Si_{1-x},Se_x)_{3+\delta}$, whereby efficiency can be additionally increased.

In an advantageous embodiment of the invention, the absorber layer comprises $Cu(In,Ga)(S,Se)_2$ with a ratio of the molar concentrations [S]/([Se]+[S]) on the surface of the absorber layer between 10% and 90%, in particular 20% to 65% and preferably 35%, with the sulfur incorporated into the anion lattice of the chalcopyrite structure. This also enables achievement of fine tuning of the bandgap and of band matching compared to $In_2(S_{1-x},Se_x)_{3+\delta}$.

It can be noted that the combination of the buffer layer with the absorber layer depends on the correct adjustment of the sulfur content in the absorber and of the selenium content in the buffer. A further advantage of this invention lies in this additional degree of freedom. For the adjustment of the optimal electronic structure on the heterotransition, no high temperatures are necessary to bring about the proper composition through interdiffusion.

In a preferred embodiment, the sulfur concentration in the absorber has a decreasing gradient from the surface, i.e., from the interface with the first buffer layer, to the interior of the absorber, whereby the efficiency is likewise positively influenced. The sulfur gradient can be adjusted in the production process of the CIS absorber through the seleniumization and sulfurization process of metal layers through suitable temperature and gas time profiles. The molar ratio S/(Se+S) declines, for example, from the surface from 20% to 60% to values around 5-10% in the interior of the absorber layer, such that the ratio S/(Se+S) is integrally clearly smaller than on the surface. The ratio S/(Se+S) can also increase all the way to the back contact. The sulfur gradient results in a bandgap gradient. The fact that a decreasing gradient of the bandgap in the base of a solar cell can result in improved efficiency is known from various solar cell technologies. However, in the combination according to the invention with the amorphous indium sulfide layer, the gradient additionally enables matching the band structures on the heterotransition of the indium sulfide/$Cu(In,Ga)(S,Se)_2$-layer system.

Advantageously, the $In_2(S_{1-x},Se_x)_{3+\delta}$-layer is between 10 nm and 200 nm thick, in particular, between 40 nm and 140 nm, preferably 60 nm, since because of this, the light absorption through the $In_2(S_{1-x}, Se_x)_{3+\delta}$-buffer layer is low.

Advantageously, the layer system according to the invention comprises a second buffer layer that is, preferably, disposed between the first buffer layer and a front electrode. Preferably, the second buffer layer applied on the first buffer layer comprises undoped $Zn_{1-z}Mg_zO$, where $0 \leq z \leq 1$. Its layer thickness is expediently as much as 200 nm, in particular 20 nm to 140 nm, preferably 60 nm.

Advantageously, a front electrode that comprises a transparent conductive oxide (TCO) is provided. In particular, it comprises indium tin oxide (ITO) and/or ZnO, with doped ZnO, in particular Al- or Ga-doped ZnO preferred.

In the layer system according to the invention, preferably provided as the carrier is a metal, glass, synthetic, or ceramic substrate, with glass being preferred. However, other transparent carrier materials can also be used, in particular synthetic materials.

Below the absorber, a back electrode, e.g., comprising molybdenum (Mo) or another metal, is preferably provided. In an advantageous embodiment of the back electrode, it has a molybdenum sublayer adjacent the absorber, and a silicon nitride sublayer (SiN), adjacent the Mo-sublayer.

Independent protection is claimed for solar cells with the layer system according to the invention and for solar cell modules that include these solar cells.

Expediently, the method for production of such a layer system is carried out such that at least the deposition of the first buffer layer is carried out in a vacuum, preferably with the generating of the entire layer system taking place in a vacuum.

An advantage of this vacuum process consists in that with it, for one thing, a higher material yield is obtained. Moreover, it is, in contrast to wet deposition, more environmentally harmless, since in contrast, for example, to chemical bath deposition, a buffer layer made of CdS generates no contaminated wastewater. And finally, different vacuum processes, such as even the production of the second undoped ZnO-buffer layer or the doped ZnO-front electrode can be combined in one plant, whereby production can take place more cost-effectively. Depending on the embodiment of the process for production of the absorber, a combination with the absorber process without air exposure is conceivable.

A further advantage consists in that through the vacuum process, the incorporation of oxygen or hydroxide is prevented. Hydroxide components in the buffer layer are, in fact, suspected of being responsible for transients in efficiency with the action of heat and light.

Advantageously, the application of the buffer layer occurs at temperatures less than or equal to 150° C., in particular, less than or equal to 130° C., and preferably between 50° C. and 100° C. This makes it possible to reduce the costs of the vacuum plant. In contrast, for example, indium sulfide buffers on $Cu(In,Ga)Se_2$, which contains no sulfur, must be deposited either at temperatures higher than 150° C. or the entire cell structure must be tempered after deposition of the ZnO-front electrode at relatively high temperatures. In the present invention, temperatures for production of the layer clearly lower than 150° C. are possible; and the cell structure does not have to be tempered afterward. This could be attributed to the fact that the sulfur-containing surface of $Cu(In,Ga)(S,Se)_2$ in the absorber/buffer layer structure according to the invention already has the proper band match with the buffer.

Expediently, the absorber layer is applied in an Avancis RTP—("rapid thermal processing") process. Therein, a precursor layer is first deposited on the substrate with a back electrode: the elements Cu, In, and Ga are applied by sputtering; as well as amorphous selenium, by thermal evaporation. In these processes, the substrate temperature is below 100° C., such that the layers remain obtained substantially unreacted as metal alloys plus elemental selenium. Then, this precursor layer is reacted in a rapid thermal process (RTP rapid thermal processing) in a sulfur-containing atmosphere to form the $Cu(In,Ga9(S,Se)_2$ chalcopyrite semiconductor.

Advantageously, the first buffer layer is thermally vaporized under a high vacuum, with the processing conditions preferably selected such that this buffer layer is deposited amorphously on the absorber layer. Thus, the growth of the amorphous layer on the polycrystalline absorber is essential for the layer system according to the invention. Since thin films grow differently on different substrates, detection is possible only on the actual layer system absorber/buffer or in the complete solar cell, but not on control specimens, by x-ray deflection in grazing incidence diffraction and using Ramen spectroscopy. It is also conceivable for both the first and second buffer layer, if the latter is used, to be applied using high-frequency sputtering (RF sputtering). The front electrode is, in turn, preferably applied in a DC-magnetron sputtering process.

Further details and advantages of the present invention are evident from the following description in conjunction with the drawings. They depict:

FIG. 1 a schematic cross-sectional view of the layer system according to the invention, FIG. 2 a graphic representation of the efficiency distribution of 32 cells with an indium sulfide selenide buffer, FIG. 3 results of Raman spectroscopy (vertical axis) on a thin film cell with an amorphous indium sulfide selenide buffer layer (horizontal axis), FIG. 4 results of Raman spectroscopy (vertical axis) on a thin-film cell with a crystalline indium sulfur selenide buffer layer (horizontal axis), with additionally calculated lines at the positions of the $CuInSe_2$-, $CuInS_2$-, ZnO-, and $In_2S_3$-phases drawn in, FIG. 5 the correlation between Raman linewidth of the peak at 326 $cm^{-1}$ (vertical axis) and linewidth of the (111)-reflex of cubic indium sulfide selenide (horizontal axis), and FIG. 6 the correlation between Raman linewidth of the peak at 326 $cm^{-1}$ (horizontal axis) and efficiency (vertical axis).

Figure 1:
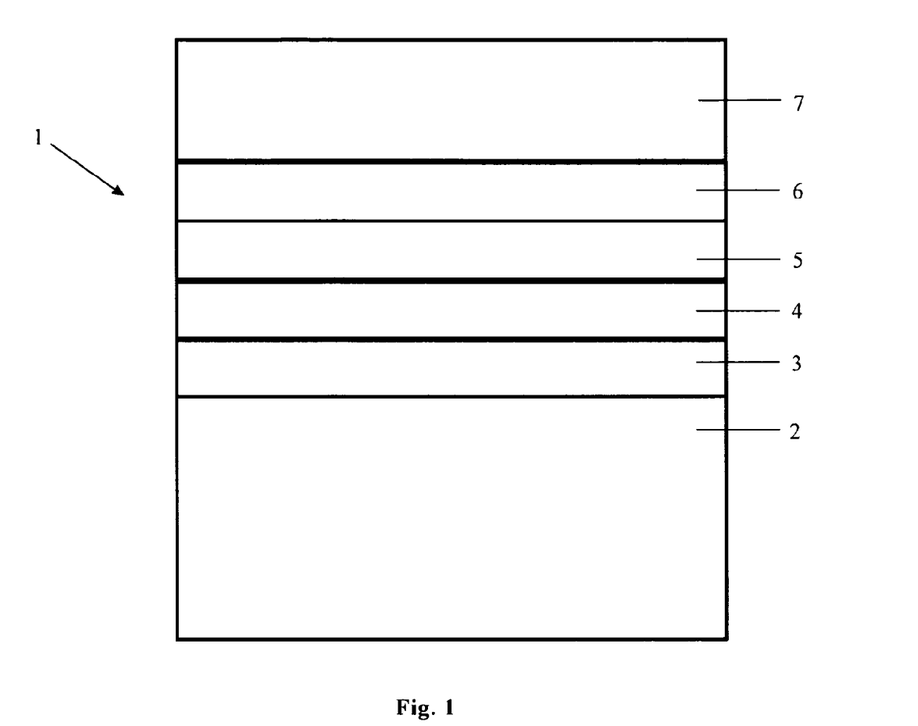

With reference to FIG. 1, the layer system according to the invention and its method of production are first dealt with in the following.

FIG. 1 depicts, purely schematically, a preferred exemplary embodiment of the layer system 1 according to the invention in a cross-sectional view. The layer system 1 comprises the substrate 2, a back electrode 3, an absorber layer 4, a first buffer layer 5, a second buffer layer 6, and a front electrode 7.

The production method begins in the conventional manner with the thermal deposition of the back contact layer 3 made of Mo on a glass substrate 2. Instead of the back electrode 3 made of Mo, it is also possible to use a stratified electrode made of a first SiN-sublayer applied on the glass substrate and a second Mo-sublayer applied thereon, which improves the characteristics of this back contact. In a further step, the absorber layer 4 made of $Cu(In,Ga)(S,Se)_2$ is applied on the back electrode 3. In further steps, the first buffer layer 5 is then made of $In_2(S_{1-x},Se_x)_{3+\delta}$; the second buffer layer 6, of undoped ZnO; and next, a front electrode 7, of ZnO doped with aluminum.

The following parameters are used. The back electrode 3 made of molybdenum has a layer thickness of 400 nm. The absorber layer 4 is produced with a thickness of 1.5 µm using the AVANCIS RTP-process. The surface of the absorber layer 4 has an anion composition [S]/([Se]+[S]) of roughly 35%. The gallium concentration on the surface is less than 1%. The $In_2(S_{1-x},Se_x)_{3+\delta}$-buffer layer 5 was thermally vaporized under a high vacuum. The selenium content of the buffer layer x is from 0 to 3%. The deviation from stoichiometry δ is roughly −0.1 (this corresponds to $In_2S_{2.9}$). The layer thickness of the first buffer layer is 80 nm. As the second buffer layer, 60 nm of undoped ZnO is deposited by an RF-sputtering process. As the front electrode, 1200 nm ZnO:Al is deposited by DC-magnetron sputtering. The processing temperatures during deposition of the absorber layer 4 and the subsequent layers 5, 6, 7 are clearly less than 150° C., namely 70° C.

Figure 2:
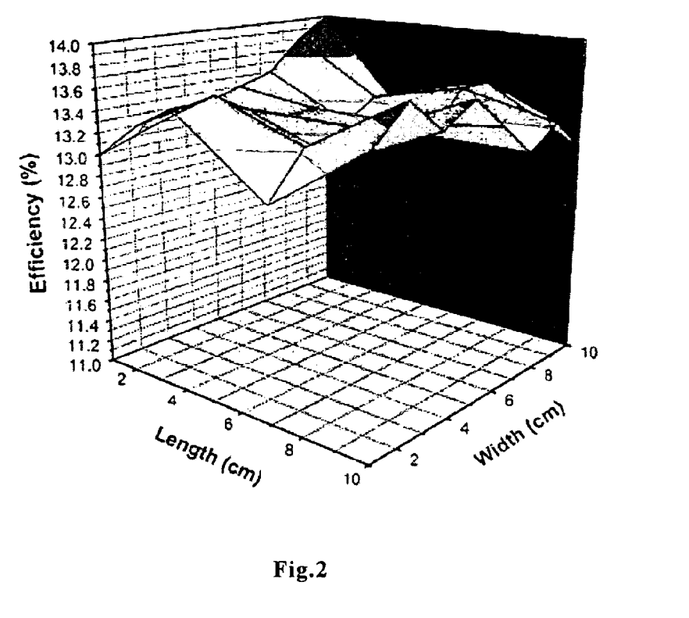

In FIG. 2, the efficiency distribution of 32 solar cells that are simultaneously applied together on a glass substrate of the size 10×10 $cm^2$ (aperture surface 1.4 $cm^2$) is depicted three-dimensionally. These 32 solar cells include the above layer system according to the invention and have a mean efficiency of 13.2%. The maximum value is 14.0%.

Figure 3:
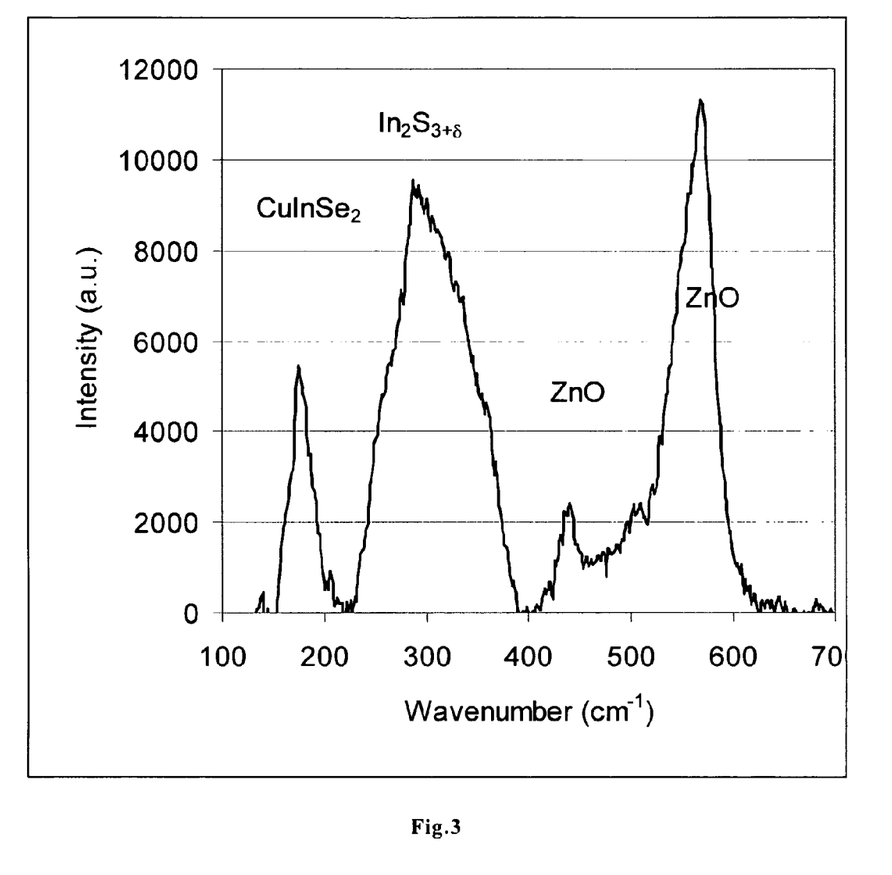
Figure 4:
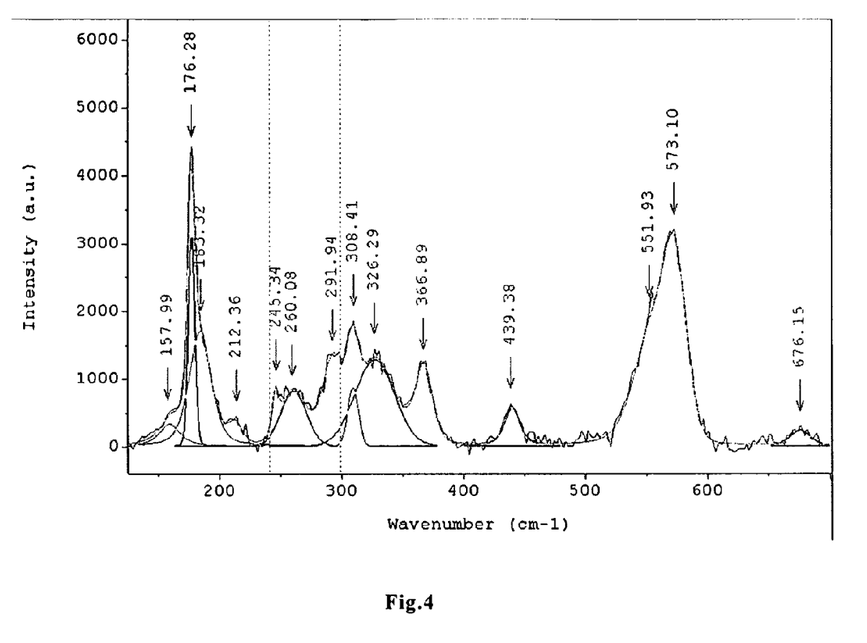

The results of Raman spectroscopy examinations on finished solar cell components are depicted in FIG. 3 and FIG. 4. These Raman spectra were measured at room temperature with an argon ion excitation laser at a wavelength of 488 nm for, in each case, a solar cell with an amorphous (FIG. 3) and a crystalline $In_2(S_{1-x},Se_x)_{3+\delta}$-layer (FIG. 4). The crystalline $In_2(S_{1-x},Se_x)_{3+\delta}$-layer is distinguished by a structured spectrum, in which the individual lines at the positions of the spectrum of $\beta$-$In_2S_3$ are readily discernible. The Raman modes observed could be assigned to the contributing phases $CuInSe_2$, $CuInS_2$, $In_2S_3$, and ZnO as follows: the line at 179 $cm^{-1}$ and the adjacent secondary modes at 210 through 220 $cm^{-1}$ to the phase $CuInSe_2$, the line at 190 $cm^{-1}$ to the phase $CuInS_2$, the lines at 189, 244, 266, 306, 326, and 367 $cm^{-1}$ to the phase $In_2S_3$ and the lines at 430 and 570 $cm^{-1}$ including the flank of excessively small wavenumbers to the phase ZnO. This layer presents, with x-ray deflection (XRD), the diffractogram of cubic $In_2S_3$, which likewise proves the crystalline nature of the specimen. With the amorphous $In_2(S_{1-x},Se_x)_{3+\delta}$-layer in FIG. 3, in contrast, in the Raman spectrum, an unstructured peak is seen in the wavenumber range in which the signals of the crystalline indium sulfide also lie, in particular, in the range from 220 to 380 $cm^{-1}$. For this specimen also, no reflections are discernible in the x-ray deflection that could be assigned to an indium sulfide phase.

Figure 5:
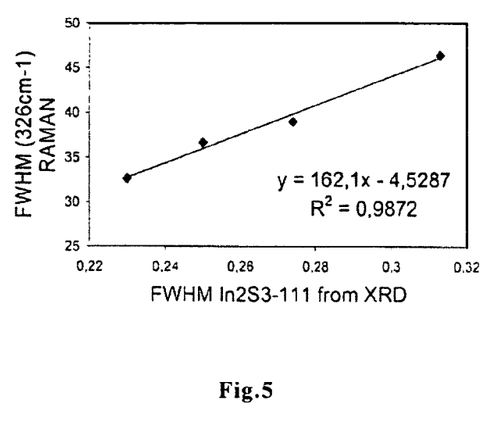

In FIG. 5, the correlation between Raman line width of the peaks at 326 $cm^{-1}$ and line width of the XRD (111)-reflex of $In_2(S_{1-x},Se_x)_{3+\delta}$-layers is depicted. In the cases where indium sulfide reflexes are discerned in the diffractogram, the width of the Raman lines corresponds well with the width of the (111)-reflex from the x-ray deflection diffractogram. The wider the line of the (111)-reflex, the wider the Raman line and the more amorphous the structure of the specimen. FIG. 5 also indicates in formula form the correlation determined between the two line widths. The width of the Raman line was determined by fitting Gaussian-Lorentzian lines on the line positions of $In_2S_3$ drawn in.

Figure 6:
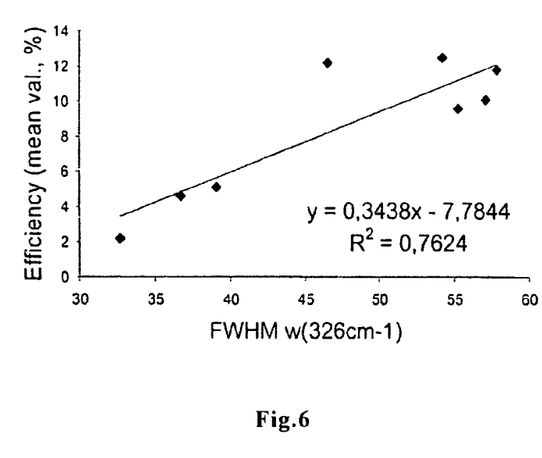

FIG. 6 again shows the correlation between Raman line width of the peak at 326 $cm^{-1}$ and efficiency for the $In_2(S_{1-x},Se_x)_{3+\delta}$-layers. It can be seen that the wider the Raman line, in other words, the more amorphous the structure, the higher the efficiency of the layers. This means that very good solar cells, i.e., cells with high efficiency, with the process parameters investigated here, and the absorbers used, are distinguished by an unstructured Raman spectrum, a very wide Raman line, and the lack of crystalline x-ray deflection reflexes of the indium sulfide layer. FIG. 6 also indicates in formula form the correlation determined between the Raman line width of the peak at 326 $cm^{-1}$ and efficiency. With highly amorphous layers, the determination of line width becomes imprecise. The layers with a completely unstructured spectrum yield the best solar cell efficiency.

From the above statements, it has become clear that through the present invention the disadvantages of CdS-buffer layers or the alternative buffer layers previously used can be overcome with thin-film solar cells, whereby the efficiency and stability of the solar cells produced therewith are also good. At the same time, the manufacturing method is economical, effective, and environmentally harmless.

The invention claimed is:

1. A layer system for thin-film solar cells, solar modules, or the like, comprising:
an absorber layer and a first buffer layer, wherein the absorber layer is based on a $Cu(In,Ga)(S_{1-y},Se_y)_2$-semiconductor compound material, with $y\leq1$,
wherein the first buffer layer comprises $In_2(S_{1-x},Se_x)_{3+\delta}$, wherein $0\leq x\leq1$ and deviation from stoichmetry, "$\delta$", is between $-0.2$ and $-0.1$,
the first buffer layer is amorphous, and
a molar concentration ratio [S]/([Se]+[S]) declines from a surface of the absorber layer facing the first buffer layer from 20% to 60% to 5 10% in the interior of the absorber layer.

2. The layer system according to claim 1, wherein $0\leq x\leq0.5$, or $0\leq x\leq0.1$.

3. The layer system according to claim 1, wherein layer thickness of the first buffer layer is between 10 nm and 200 nm or between 40 nm and 140 nm or is 80 nm.

4. The layer system according to claim 1, further comprising a second buffer layer disposed on the first buffer layer.

5. The layer system according to claim 4, wherein the second buffer layer comprises undoped $Zn_{1-z}Mg_zO$, wherein $0\leq z\leq1$.

6. The layer system according to claim 4, wherein layer thickness of the second buffer layer is up to 200 nm or between 10 nm to 140 nm or is 60 nm.

7. The layer system according to claim 1, further comprising a front electrode above the first buffer layer, the front electrode consisting of a transparent conductive oxide.

8. The layer system according to claim 1, wherein gallium concentration on the surface of the absorber layer is less than 1%.

9. The layer system according to claim 1, wherein chlorine and/or oxygen concentration of the first buffer layer is less than or equal to 1 Mol %.

10. A solar cell or solar cell module comprising the layer system according to claim 1.

11. The layer system according to claim 7, wherein the transparent conductive oxide is Al- or Ga- doped ZnO.

12. The layer system according to claim 1, wherein the molar concentration ratio [S]/([Se]+[S]) decline enables matching the band structures of the layer system.

13. The layer system according to claim 1, wherein the deviation from stoichiometry, "$\delta$", is $-0.1$.

14. The layer system according to claim 1, wherein a ratio of power shining in to the electrical power produced by a solar cell is between 12.2% and 14.3%.

* * * * *